US010763664B2

(12) United States Patent
Jordanger et al.

(10) Patent No.: US 10,763,664 B2
(45) Date of Patent: Sep. 1, 2020

(54) DRIVER AND SLEW-RATE-CONTROL CIRCUIT PROVIDING SOFT START AFTER RECOVERY FROM SHORT

(71) Applicant: Texas Instruments Incorporated, Dallas, TX (US)

(72) Inventors: Ricky Dale Jordanger, Allen, TX (US); Hector Torres, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/132,790

(22) Filed: Sep. 17, 2018

(65) Prior Publication Data

US 2019/0393697 A1 Dec. 26, 2019

Related U.S. Application Data

(60) Provisional application No. 62/688,131, filed on Jun. 21, 2018.

(51) Int. Cl.
*H02H 9/00* (2006.01)
*H02H 9/02* (2006.01)
*H03K 17/687* (2006.01)

(52) U.S. Cl.
CPC ............ *H02H 9/001* (2013.01); *H02H 9/025* (2013.01); *H03K 17/687* (2013.01)

(58) Field of Classification Search
CPC .......... H02H 9/001; H02H 9/005; H02H 9/02; H02H 9/025; H03K 17/687
USPC .................................................. 327/170, 520
See application file for complete search history.

(56) References Cited

U.S. PATENT DOCUMENTS

| 5,397,967 A | * | 3/1995 | Carobolante | ........ H03K 17/063 |
| | | | | 318/400.19 |
| 5,886,554 A | * | 3/1999 | Corsi | ............... H03K 19/00361 |
| | | | | 327/103 |
| 5,939,909 A | * | 8/1999 | Callahan, Jr. | ............. H03K 4/00 |
| | | | | 327/108 |
| 10,298,219 B2 | * | 5/2019 | Lee | .................. H03K 17/04106 |

(Continued)

FOREIGN PATENT DOCUMENTS

| SU | 903838 A | 2/1982 |
| WO | 2013131596 A1 | 9/2013 |

OTHER PUBLICATIONS

PCT Search Report dated Sep. 19, 2019.

*Primary Examiner* — William Hernandez
(74) *Attorney, Agent, or Firm* — Lawrence J. Bassuk; Charles A. Brill; Frank D. Cimino (57) ABSTRACT

A slew-rate-control (SLC) circuit is coupled to an input for a driver circuit to provide a first binary value when the circuit is powered on and to control a slew rate when a pass element controlled by the driver circuit is enabled. The SLC circuit includes a capacitor node for coupling to a first terminal of an external capacitor, the capacitor node being coupled to the input. The SLC circuit also includes a SLC element coupled between the input and a first source of voltage to define the slew rate and a reset FET coupled between the input and a second source of voltage. The reset FET's gate is controlled by an over-current-protection signal that changes binary value when a short is detected. The reset FET is coupled to return the input to the first binary value responsive to detection of a short

18 Claims, 6 Drawing Sheets

(56) References Cited

U.S. PATENT DOCUMENTS

| | | | |
|---|---|---|---|
| 2007/0030709 A1* | 2/2007 | Kitagawa | H02M 1/36 363/49 |
| 2014/0043077 A1 | 2/2014 | Brauer | |
| 2016/0252924 A1 | 9/2016 | Masoumi | |
| 2019/0363626 A1* | 11/2019 | Takano | H03K 17/687 |

* cited by examiner

DRIVER AND SLEW-RATE-CONTROL CIRCUIT PROVIDING SOFT START AFTER RECOVERY FROM SHORT

PRIORITY UNDER 35 U.S.C. § 119(e) & 37 C.F.R. § 1.78

This non-provisional application claims priority based upon the following prior United States provisional patent application(s): (i) "DRIVER SOFT-START RECOVERY CIRCUIT," Application No. 62/688,131, filed Jun. 21, 2018, in the name(s) of Ricky Dale Jordanger and Hector Torres, which is hereby incorporated by reference in its entirety.

FIELD OF THE DISCLOSURE

Disclosed embodiments relate generally to the field of circuits for power management systems. More particularly, and not by way of any limitation, the present disclosure is directed to a driver and slew-rate-control circuit that provides soft start after recovery from a short.

BACKGROUND

Load switches and low dropout (LDO) regulators for power management systems require fixed or adjustable soft start upon enable and also upon recovery from various faults. Soft starts avoid large in-rush currents into the load, which could potentially pull down the input power supply below recommended operating conditions. Although these devices generally provide soft start on enable and in response to some faults, not all load switches or LDOs demonstrate soft start during recovery from short circuit conditions.

SUMMARY

Disclosed embodiments provide simple slew-rate-control circuits to implement soft start during recovery from a short on the output for both load switches and LDOs. In the disclosed embodiments, the circuit to implement soft start during recovery from a short requires only one or two additional transistors and can provide a simple solution for the need for soft start during the recovery.

In one aspect, an embodiment of a slew-rate-control circuit coupled to an input for a driver circuit is disclosed, the slew-rate-control circuit being coupled to provide a first binary value when the slew-rate-control circuit is powered on and to control a slew rate between the first binary value and a second binary value when a pass element controlled by the driver circuit is enabled. The slew-rate-control switch circuit includes a first capacitor node for coupling to a first terminal of an external capacitor, the first capacitor node being coupled to the input for the driver circuit, a slew-rate-control element coupled between the input for the driver circuit and a first source of voltage to define the slew rate; and a reset field-effect transistor (FET) coupled between the input for the driver circuit and a second source of voltage, the reset FET having a gate controlled by an over-current-protection signal that changes binary value when a short to a low potential is detected, the reset FET being coupled to return the input for the driver circuit to the first binary value responsive to detection of a short.

In another aspect, an embodiment of a load switch circuit implemented on an integrated circuit chip is disclosed. The load switch circuit includes a first node for coupling to an input voltage; a second node for coupling to an external load; a third node for coupling to a ground plane; a first P-type field effect transistor (PFET) coupled between the first node and the second node to control an output voltage to the external load; a driver circuit coupled to control a gate of the first PFET, the driver circuit comprising a first N-type field effect transistor (NFET) coupled between the first node and the third node, the gate of the first PFET being coupled to the source of the first NFET; a slew-rate-control circuit coupled to a gate of the first NFET, the slew-rate-control circuit comprising a first capacitor node for coupling to a first terminal of an external capacitor, the first capacitor node being coupled to the gate of the first NFET, a second PFET coupled in series with a first current sink between the first node and the third node, a point between a drain of the second PFET and the first current sink being coupled to the gate of the first NFET, a gate of the second PFET being coupled to receive a power down bar signal that is coupled to be high when the load switch is turned on, and a reset PFET coupled in series with a feedback NFET between the first node and the gate of the first NFET, a gate of the feedback NFET being coupled to the gate of the first PFET and a gate of the reset PFET being coupled to receive an over-current-protection signal that is coupled to be low when a short to a low potential occurs.

In another aspect, an embodiment of a circuit implemented on an integrated circuit chip to control an output voltage to an external load is disclosed. The circuit includes a pass element coupled between a first node for coupling to an input voltage and a second node for coupling to the external load, the pass element coupled to control the output voltage provided to the external load; a driver circuit coupled to control a gate of the pass element; and a slew-rate-control circuit coupled to a first input for the driver circuit, the slew-rate-control circuit coupled to provide a first binary value when the slew-rate-control circuit is powered on and to control a slew rate between the first binary value and a second binary value when the pass element is enabled, the slew-rate-control circuit comprising: a first capacitor node for coupling to a first terminal of an external capacitor, the first capacitor node being coupled to the first input for the driver circuit, a slew-rate-control element coupled between the first input for the driver circuit and a first source of voltage to define the slew rate; and a reset field-effect transistor (FET) coupled between the first input for the driver circuit and a second source of voltage, the reset FET having a gate coupled to receive an over-current-protection signal that changes binary value when a short to a low potential is detected, the reset FET being coupled to return the first input for the driver circuit to the first binary value responsive to detection of a short.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

For the purposes of this patent application, reference to an upper rail and a lower rail are intended to reference the upper and lower power supply lines. In general, the upper rail refers to the input voltage Vin and the lower rail refers to a local ground, which may or may not be the same as ground. Likewise, reference to a low or high value for the voltage on a signal refers to a value that is interpreted as either zero or one, i.e., a binary value. Two signals may have the same binary value of zero or one, but not share the exact same voltage.

Figure 1:
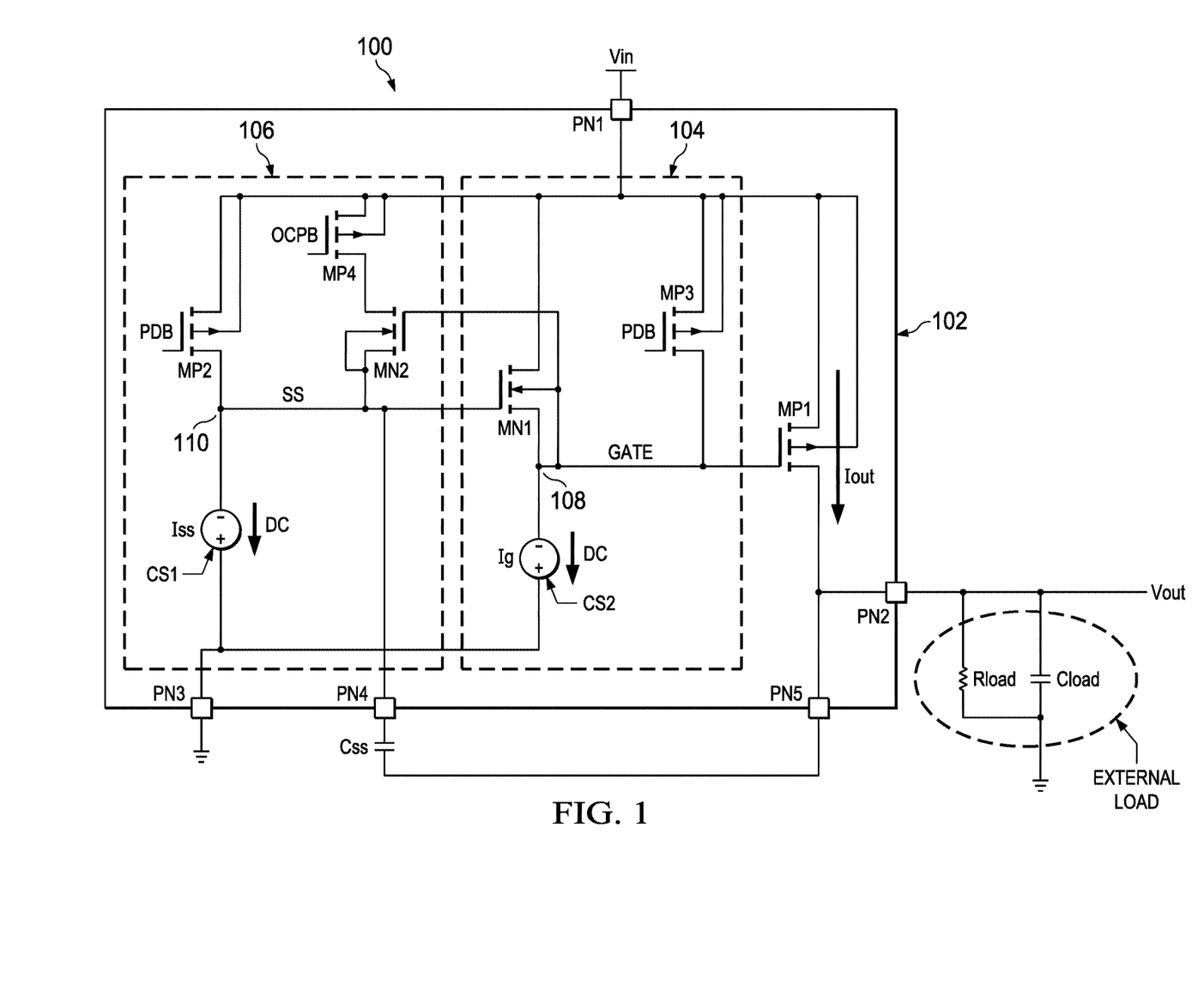
FIG. 1 depicts a P-type load switch according to an embodiment of the disclosure.

FIG. 1 depicts an example load switch circuit 100 implemented on an integrated circuit (IC) chip 102. Load switch circuit 100 is shown as a stand-alone IC chip 102, but can also be implemented as part of a larger chip that includes additional circuits. A majority of commercial load switches use an N-type field effect transistor (NFET) for the pass element; however, the embodiment of FIG. 1 was designed for use in space and utilizes a first P-type field effect transistor (PFET) MP1 for improved performance in a radiation environment. As shown in this figure, IC chip 102 includes five nodes that can be coupled to external circuits or voltage sources; in one embodiment, these nodes are coupled to pins during packaging. A first node PN1 is for coupling to an input voltage Vin to provide an upper rail for load switch circuit 100. Second node PN2 is for coupling to an external load, represented in this figure as external capacitor Cload and resistor Rload, and provides the output voltage Vout. A third node PN3 is for coupling to a ground plane and provides the lower rail for load switch circuit 100. A fourth node PN4, which can also be referred to as a first capacitor node, is for coupling to a first terminal of an external soft-start capacitor Css that is used to store the energy that helps control the slew rate of the pass element. An optional fifth node PN5 or second capacitor node is for coupling to the second terminal of the external soft-start capacitor Css and couples the external soft-start capacitor Css to the drain of first PFET MP1 and to the second node. In an alternate embodiment, not specifically shown, the second terminal of the external soft-start capacitor Css is coupled to the lower rail.

As shown in FIG. 1, load switch circuit 100 includes a driver circuit 104 and a slew-rate-control circuit 106. Other circuits (not specifically shown) can include control logic for the driver circuit 104 and optionally, a quick output discharge circuit, a thermal shutdown circuit, a reverse current protection circuit and a current limiting circuit. First PFET MP1 is coupled between the first node and the second node, with a source coupled to receive input voltage Vin, a drain coupled to provide the output voltage Vout, and a gate.

Slew-rate-control circuit 106 includes second PFET MP2, a reset PFET MP4, a feedback NFET MN2, first current sink CS1 and fourth node PN4 for coupling to soft-start capacitor Css. Fourth node PN4 is coupled to the node SS, which provides the input for driver circuit 104. Second PFET MP2, which receives a power-down-bar (PDB) signal on the gate, is coupled in series with first current sink CS1 between the first node and the third node, with node SS being coupled to a point 110 between the drain of second PFET MP2 and first current sink CS1. Reset PFET MP4 is coupled in series with feedback NFET MN2 between the first node and the SS node. The gate of reset PFET MP4 receives the over-current-protection-bar (OCPB) signal, while the gate of feedback NFET MN2 is coupled to the gate of first PFET MP1.

Driver circuit 104 includes a first N-type field effect transistor (NFET) MN1, a third PFET MP3 and a second current sink CS2. Third PFET MP3 is coupled between the first node and the gate for the pass element, first PFET MP1, and the gate of third PFET MP3 receives the signal PDB. First NFET MN1 is coupled in series with second current sink CS2 between the first node and the third node, with the gate of first PFET MP1 being coupled to a node 108 that lies between the source of first NFET MN1 and second current sink CS2. The gate of first NFET MN1 is labeled SS and the slew-rate-control circuit 106 that is coupled to node SS provides a soft start ramp when first PFET MP1 is turned on.

The operation of load switch circuit 100 is as follows. When the system is powered on, the signal PDB is low; second and third PFET transistors MP2, MP3 are turned on, pulling both the SS node and the GATE node to the input voltage Vin so that external soft-start capacitor Css is charged, first NFET MN1 is turned on, first PFET MP1 is turned off and no current flows through the load switch. To achieve this end, second PFET MP2 is designed to provide a larger current than is passed by first current sink CS1; similarly, third PFET MP3 is designed to provide a larger current than is passed by second current sink CS2. When the load switch is to be enabled, the signal PDB goes high; second PFET MP2 and third PFET MP3 turn off, so that first and second current sinks CS1 and CS2 pull down respectively on the SS node and the GATE node. The current Iss through first current sink CS1 discharges the SS node and soft-start capacitor Css at a steady rate to slowly turn off first NFET MN1. First NFET MN1 is a source follower transistor implemented as a low threshold voltage (Vt) transistor and causes the value on the GATE node to follow the value on the SS node. Current Iss passed by first current sink CS1 sets the turn on slew rate of first PFET MP1. Current Ig is the pull-down current for the GATE.

Two signals, over-current-protection (OCP) and OCPB are available to drive a response to the detection of a short to a low potential such as ground, with over-current-protection signal OCP set to be low unless a short is detected and over-current-protection signal OCPB set to be high unless a short is detected. A sub-circuit that is not specifically shown in the figures can provide either of these over-current-protection signals; over-current-protection signal OCPB was utilized in load switch circuit 100, but overcurrent protection signal OCP is shown in some of the other example circuits. In the case of a short to a low potential on output voltage Vout, an analog circuit not shown in FIG. 1 will pull up on the GATE signal to limit the current in first PFET MP1. At the same time, the over-current-protection signal OCPB goes low, turning on reset PFET MP4, which enables feedback NFET MN2 to pull the SS node high again so that soft-start capacitor Css can be charged and ready to soft start the output once the short is removed from the output of the P-type switch. Feedback NFET MN2 is also a source follower; while normal operation of load switch circuit 100 is for the value on the GATE node to follow the value on the SS node, during a short, enabling feedback NFET MN2 causes the value on the SS node to follow the value on the GATE node.

Figure 2:
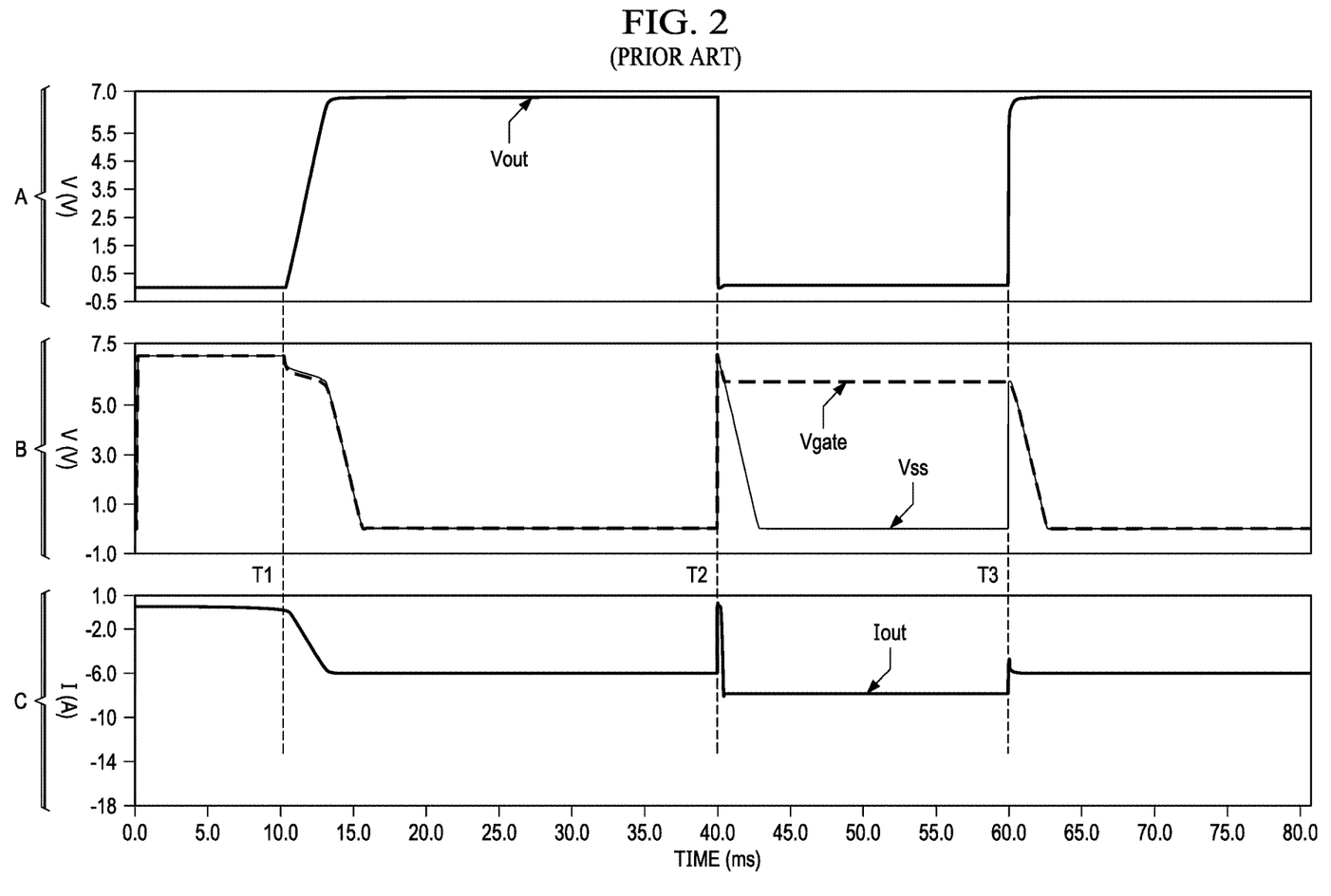
FIG. 2 depicts a number of signals from the load switch of FIG. 1 during and after startup and a short when recovery after short is not utilized.

FIG. 2 contains Graphs A, B and C that each depict signals associated with a driver circuit for a load switch that does NOT have the disclosed soft start after short recovery; the signals are shown during power on and enablement of the circuit with a 6 Amp load, followed by a 10 milliohm short with a 7.5 Amp current limit setting. Graph A depicts the output voltage Vout; Graph B depicts both the voltage Vss on the SS node and the voltage Vgate on the GATE node, which have nearly identical values on the left-hand side of the graph; and Graph C depicts the output current Iout. As the graphs begin, the circuit is powered on, with signal PDB low. With signal PDB low, both of second and third PFETs MP2 and MP3 are turned on, which pulls up both the SS node and the GATE node. Voltages Vgate and Vss rise to a high binary value, which keeps first PFET MP1 off and charges soft-start capacitor Css. At time T1, signal PDB goes high and the values of voltages Vss and Vgate begin to drop, although the drop is initially slowed as soft-start capacitor Css releases the voltage stored thereon, providing a ramping voltage on output voltage Vout and a corresponding ramp in the output current Iout.

After the current has stabilized, a short occurs at time T2. Since the circuit has an over current limit set by the user, an over current circuit that is not part of this disclosure immediately pulls up on the GATE node to turn off the switch, but then allows a current up to the current limit to flow as output current Iout, so that service is not disrupted but no damage is caused downstream to the load. Although the value of voltage Vgate is pulled high, the value of voltage Vss, after an initial reaction to the short, drops back to a low value, so that first NFET MN1 is turned off. When the short is resolved at time T3, the voltage Vss on node SS immediately jumps to a high value and then both voltages Vss and Vgate drop. However, because voltage Vss on node SS remained low during the short, soft-start capacitor Css was never charged and is unable to slow the drop of the voltage Vss and therefore voltage Vgate. The output voltage Vout does not ramp up, but jumps immediately to a high value, potentially causing large in-rush currents into the load.

Figure 3:
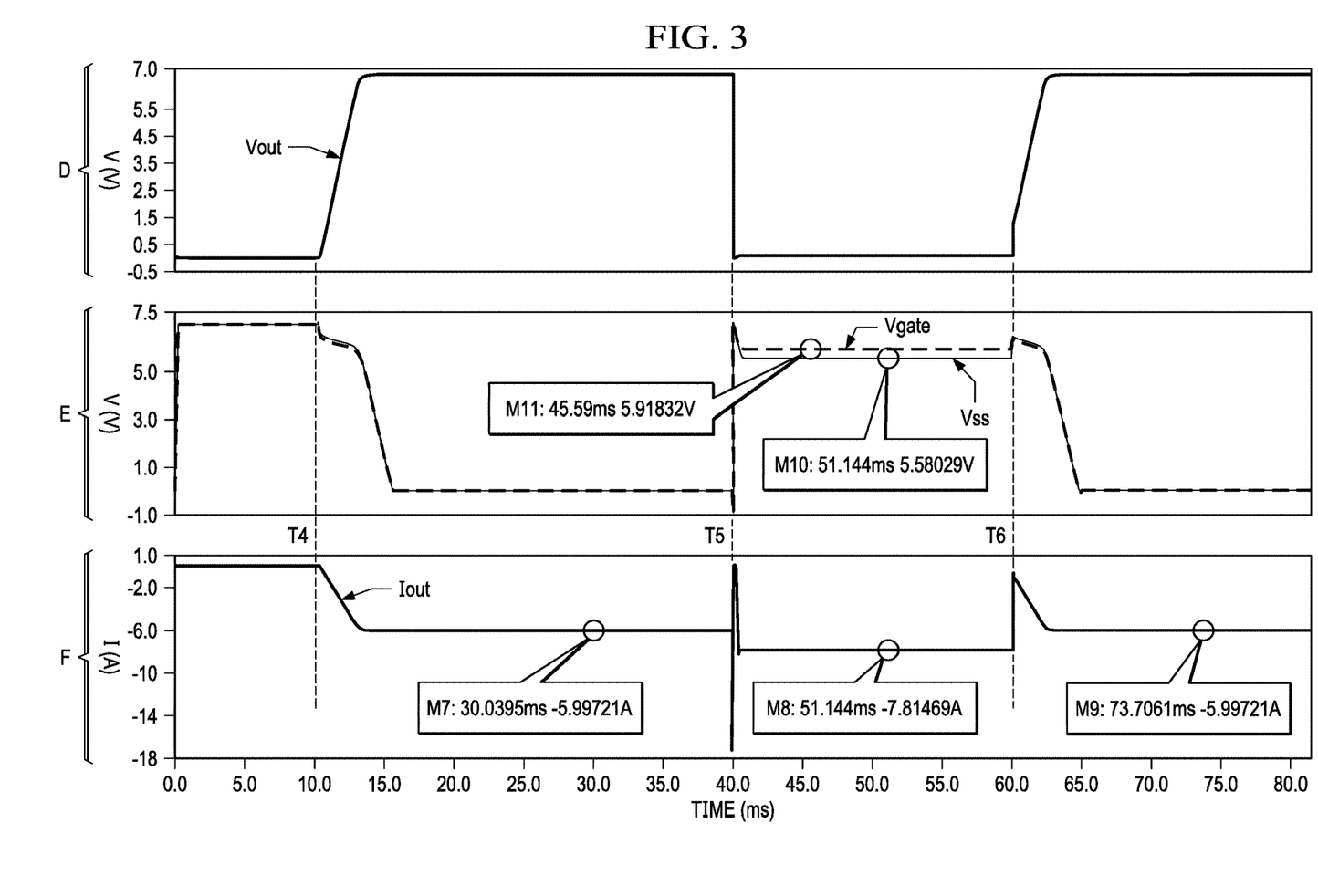
FIG. 3 depicts a number of signals from a load switch during and after startup and a short according to an embodiment of the disclosure.

FIG. 3 contains Graphs D, E and F and depicts the same situation as FIG. 2 during startup and after a short when using load switch circuit 100 with soft start recovery after a short. When signal PDB is turned on at time T4, the drop in voltage of Vss and Vgate is again slowed by the discharge of soft-start capacitor Css, providing the desired ramp on output voltage Vout and output current Iout. After a short occurs at time T5, voltage Vgate on the GATE node is again pulled up by an over-current circuit that is not specifically shown in FIG. 1. However, since over-current-protection signal OCPB is set to a low value when the short is detected, reset PFET MP4 is turned on and feedback NFET MN2 is turned on by the same circuit that pulls up voltage Vgate on the GATE node. This combination pulls up voltage Vss on node SS to a high value close to that of voltage Vgate. Whereas voltage Vgate generally follows voltage Vss, in the case of a short, voltage Vss follows voltage Vgate. Because voltage Vss is pulled high during the short, soft-start capacitor Css will be charged during the short. When the short is resolved at time T6, the discharge of soft-start capacitor Css slows the drop of voltage Vss on the SS node and therefore the drop of voltage Vgate on the GATE node. As a result, output voltage Vout does not rise precipitously, but exhibits the desired ramp-up.

Figure 4:
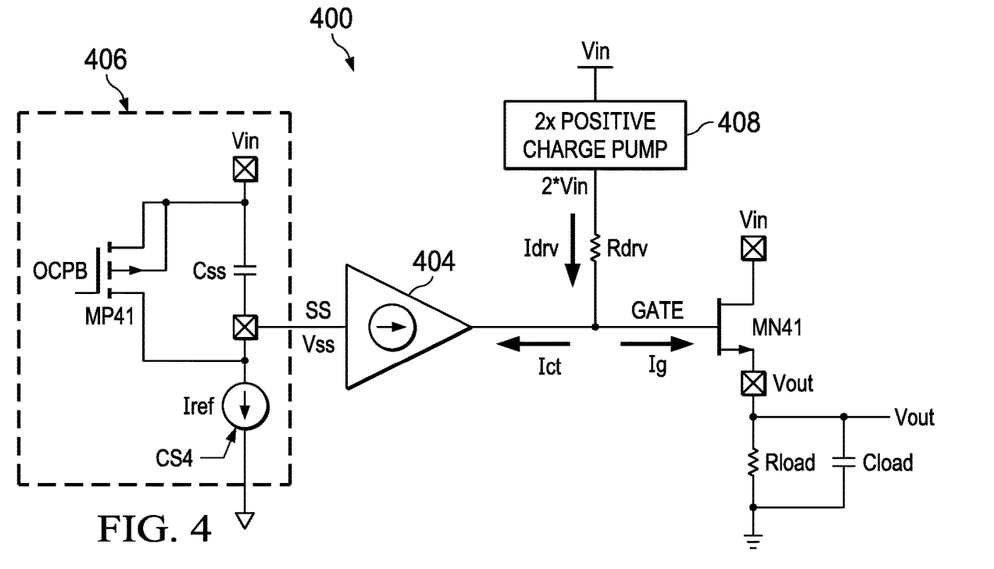
FIG. 4 depicts an N-type load switch according to an embodiment of the disclosure.
Figure 5:
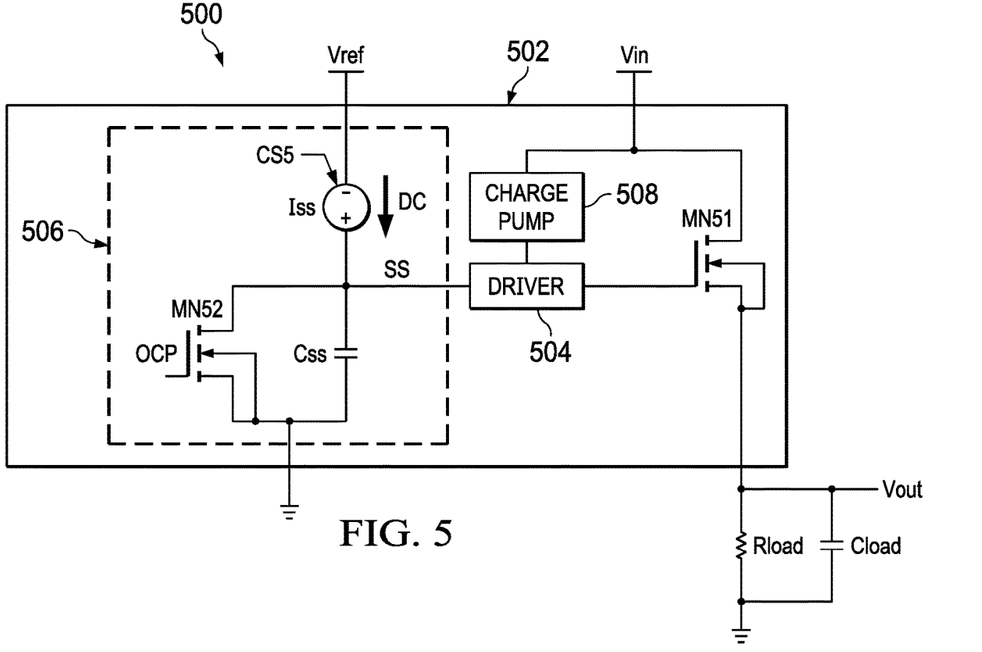
FIG. 5 depicts an N-type load switch according to an embodiment of the disclosure.
Figure 6:
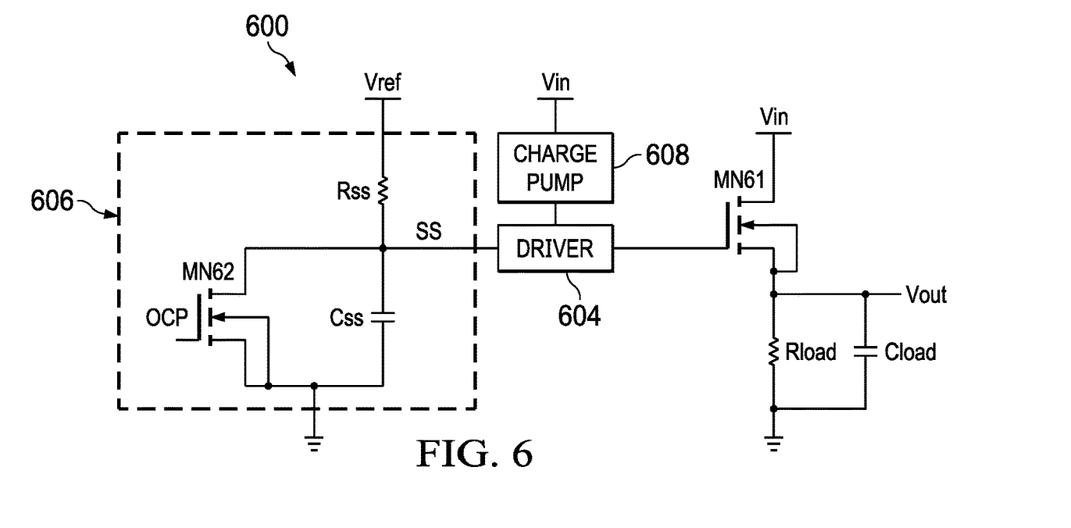
FIG. 6 depicts an N-type load switch according to an embodiment of the disclosure.

The circuit of FIG. 1 exhibits resetting of the SS node and soft-start capacitor Css for a P-type load switch; a similarly simple result can also be obtained for an N-type load switch, as shown in FIGS. 4-6. FIG. 4 depicts an example load switch circuit 400 having an N-type pass element NFET MN41, a driver circuit 404, charge pump 408 and a slew-rate-control circuit 406. In this embodiment, positive charge pump 408 is coupled in series with drive resistor Rdrv between the input voltage Vin and the GATE node for the NFET MN41 and provides a voltage that is twice the value of input voltage Vin. When NFET MN41 is enabled, drive current Idrv from charge pump 408 changes as the value on the GATE node comes up. Driver circuit 404 is a voltage-dependent current source and converts the voltage Vss provided on node SS into a current to the GATE node that cancels part of the drive current Idrv, i.e., current Ict, so that the gate current Igate applied to the GATE node is as constant as possible.

Slew-rate-control circuit 406 needs to provide a voltage on the SS node that starts out with a high value and discharges to a low value. To provide the desired voltage changes on the SS node, soft-start capacitor Css is coupled in series with current sink CS4 between input voltage Vin and the lower rail, with the input for driver circuit 404 being taken from a point between soft-start capacitor Css and current sink CS4. Current sink CS4 passes a reference current Iref Although not specifically shown in this figure, soft-start capacitor Css is generally an external capacitor that is coupled to a node on load switch circuit 400. Reset FET MP41 is coupled in parallel with soft-start capacitor Css between the upper rail and the SS node and receives over-current-protection signal OCPB on the gate. When the load switch circuit 400 is powered on, soft-start capacitor Css will be charged, then discharges when the load switch circuit 400 is enabled. If a short occurs while load switch circuit 400 is on, over-current-protection signal OCPB goes from a high value to a low value, turning on PFET MP42 and shorting input voltage Vin to the SS node so that soft-start capacitor Css is again set to a high value, ready to provide the desired voltage Vss on the SS node to cancel current Ict.

FIG. 5 depicts a generalized version of a load switch circuit 500 implemented on an IC chip 502. Load switch circuit 500 has an N-type pass element, NFET MN51, driver circuit 504, charge pump 508 and slew-rate-control circuit 506. Slew-rate-control circuit 506 includes soft-start capacitor Css, which is again generally external, coupled in series with current source CS5 between reference voltage Vref and the lower rail. A point between current source CS5 and soft-start capacitor Css is coupled to node SS to provide the input for driver circuit 504. Reset NFET MN52 is coupled in parallel with soft-start capacitor Css between node SS and the lower rail and receives over-current-protection signal OCP, which is set to be low during normal conditions, but which goes high during a short to a low potential.

When load switch circuit 500 is powered on, node SS has a low value. When load switch circuit 500 is enabled, current source CS5 supplies a current that increases the voltage on node SS, while the presence of soft-start capacitor Css causes the voltage on the SS node to increase slowly as the capacitor is charged. When a short occurs on the output node while load switch circuit 500 is enabled, over-current-protection signal OCP goes high. Over-current-protection signal OCP turns on reset NFET MN52 and couples node SS to the lower rail, discharging both node SS and soft-start capacitor Css so that these elements are again available to provide a soft start for driver circuit 504 and pass element NFET MN51.

FIG. 6 depicts an alternate generalization of a load switch circuit 600 that uses an NFET MN61 as a pass element. Load switch circuit 600 also includes a driver circuit 604, slew-rate-control circuit 606 and charge pump 608. In this embodiment, slew-rate-control circuit 606 replaces the current source CS5 of FIG. 5 with a resistor Rss, while reset NFET MN62 is coupled in parallel with soft-start capacitor Css. When load switch circuit 600 is powered on, node SS has a low value, then when load switch circuit 600 is enabled, soft-start capacitor Css is charged by a voltage provided through resistor Rss, so that the voltage on node SS into driver circuit 604 ramps up as soft-start capacitor Css is charged. During a short on the output node, over-current-protection signal OCP goes high, turning on reset NFET MN62 and coupling node SS to the lower rail to reset soft-start capacitor Css to a low value to be ready to provide a soft start after recovery from the short.

Figure 7:
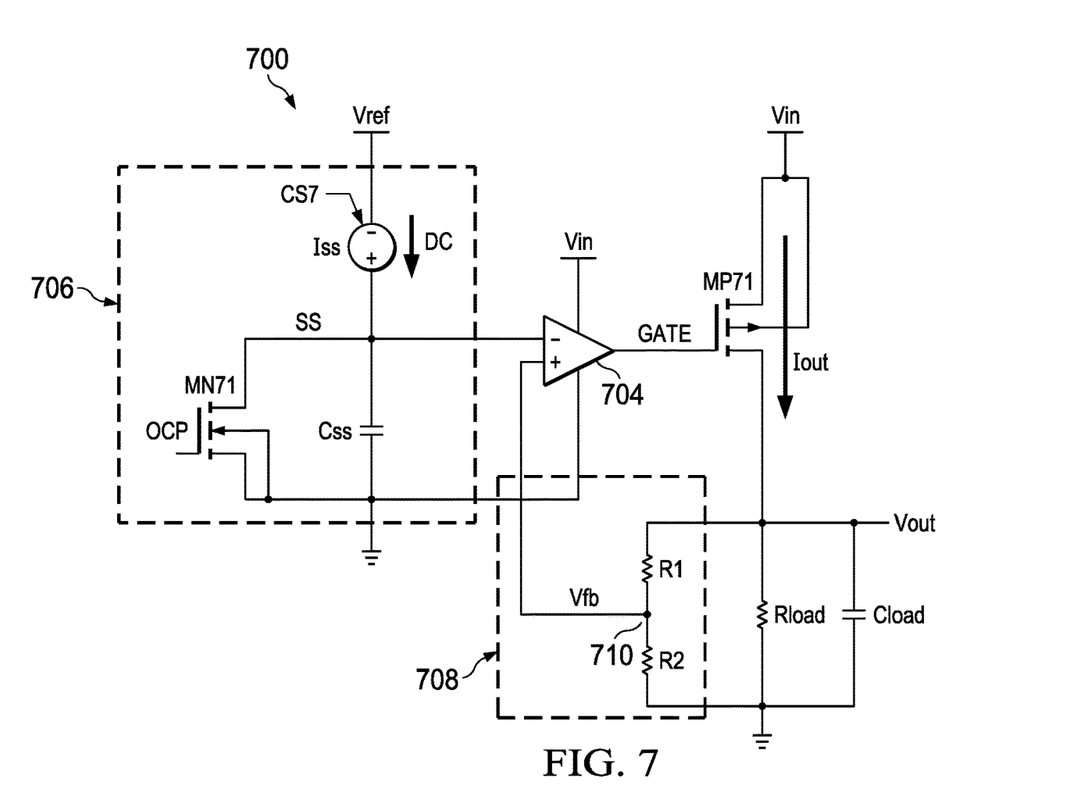
FIG. 7 depicts a P-type LDO according to an embodiment of the disclosure.
Figure 8:
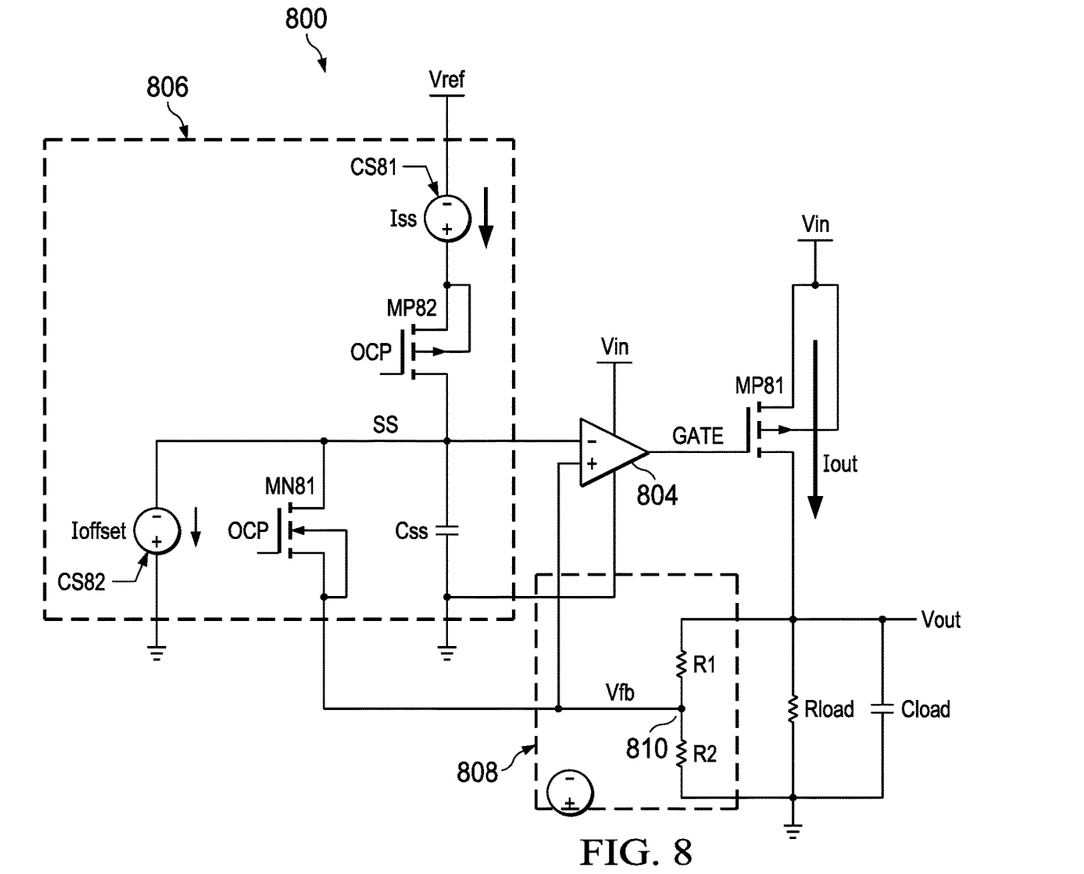
FIG. 8 depicts a P-type LDO according to an embodiment of the disclosure.

In addition to load switches, low dropout (LDO) regulators can also benefit from the disclosed slew-rate-control circuits. FIGS. 7 and 8 illustrate two versions of an LDO implemented on an IC chip (not specifically shown) containing a PFET for the pass element and a slew-rate-control circuit according to an embodiment of the disclosure. In FIG. 7, LDO 700 includes pass element PFET MP71, driver circuit 704, slew-rate-control circuit 706 and feedback circuit 708. Driver circuit 704 includes an error amplifier and provides a control voltage to the node GATE of PFET MP71. Driver circuit 704 receives a first input from the slew-rate-control circuit 706 on an inverting input and a second input from feedback circuit 708 on a non-inverting input. Feedback circuit 708 includes resistors R1 and R2 coupled in series between the drain of PFET MP71 and the lower rail; a point 710 between resistors R1 and R2 is coupled to the non-inverting input for driver circuit 704 to provide feedback voltage Vfb.

Slew-rate-control circuit 706 includes current source CS7 coupled in series with soft-start capacitor Css (which is generally external) between a voltage reference Vref and the lower rail. A point between current source CS7 and soft-start capacitor Css is coupled to a first input for driver circuit 704. Reset NFET MN71 is coupled in parallel with soft-start capacitor Css between the first input for the driver circuit and the lower rail; reset NFET MN71 receives the over-current-protection signal OCP, which has a low value except when a short occurs, at which time over-current-protection signal OCP has a high value. When LDO 700 is powered on, node SS has a low value; then when the circuit is enabled, current source CS7 provides a current Iss that charges soft-start capacitor Css so that node SS ramps up slowly rather than jumping immediately to a high value. A short on output voltage Vout while the LDO is enabled causes over-current-protection circuit OCP to change from a low value to a high value, turning on reset NFET MN71 and shorting the SS node to the lower rail to reset soft-start capacitor Css. A separate circuit (not specifically shown) will pull the GATE node up to limit the current through PFET MP71. In an alternate embodiment, current source CS7 can be replaced by a resistor (not specifically shown).

LDO 800 of FIG. 8 shares many of the same elements as LDO 700 of FIG. 7, including a pass element PFET MP81, a driver circuit 804 that includes an error amplifier, feedback circuit 808 and slew-rate-control circuit 806. Driver circuit 804 receives a voltage on the SS node at an inverting input and a feedback voltage Vfb taken from point 810 between resistors R1 and R2 of feedback circuit 808 on the non-inverting input. Slew-rate-control circuit 806 includes soft-start capacitor Css, which again is generally external, and which is coupled in series with current source CS81 and reference voltage enable PFET MP82 between a reference voltage and the lower rail; the SS node is coupled to a point between the drain of reference-voltage enable PFET MP82 and soft-start capacitor Css. Slew-rate-control circuit 806 also includes an offset current sink CS82 that is coupled between the SS node and the lower rail, and reset NFET MN81, which is coupled between the SS node and a point between the first and second resistors of the feedback loop 808. During a short to a low potential, reset NFET MN81 shorts the SS node to the point between resistors R1 and R2 of the feedback loop. Shorting the SS node to the feedback loop allows the LDO output to recover faster after the short is removed but also requires that the offset current !offset be added to slew-rate-control circuit 806 to force an offset at the inverting input for the LDO driver in order to avoid oscillation in the circuit. As was true in FIG. 7, an alternate embodiment can replace current source CS81 and offset current sink CS82 with resistors (not specifically shown).

Applicants have disclosed a very simple method of providing a soft start after recovery from a short. As has been shown, a slew-rate-control circuit according to the disclosure need only include a node for coupling an external slow start capacitor (or alternatively, an internal capacitor) to an input for the driver circuit, a slew-rate-control element coupled between the input for the driver circuit and a first source of voltage to define the slew rate, and a reset FET coupled between the input for the driver circuit and a second source of voltage. Examples of the first and second source of voltage are the input voltage, a ground voltage, a reference voltage, the output voltage or some fraction of the output voltage. The slew-rate-control element can be a current source, a current sink or a resistor. Additional elements can be added as determined by the needs of the circuit. The added one or two transistors are small, requiring very little additional space to implement the innovative circuit.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A slew-rate-control circuit comprising:
   a pass transistor having a load output and having a load gate;
   driver circuitry having a driver input and having a driver output coupled to the load gate;
   a first capacitor node adapted to be coupled to a first terminal of an external capacitor, the first capacitor node being coupled to the driver input;
   a slew-rate-control element coupled between a first voltage source and the driver input, the slew-rate-control element having a power down input; and
   a reset field-effect transistor (FET) coupled between a second voltage source and the driver input, the reset FET having an over-current-protection input separate from the power down input.

2. The slew-rate-control circuit as recited in claim 1 in which the slew-rate-control element is selected from a group that consists of a current source, a current sink and a resistor.

3. The slew-rate-control circuit as recited in claim 1 in which the first voltage source and the second voltage source are each selected from a group that includes an upper rail, a lower rail, a reference voltage, an output voltage of the pass transistor, and a feedback voltage from the pass transistor.

4. The slew-rate-control circuit as recited in claim 1 including a feedback transistor coupled in series with the reset FET between the second source of voltage and the driver input, the feedback transistor having a gate coupled to the load gate.

5. A load switch circuit comprising:
   a supply voltage input;
   a load output;
   a ground plane node;
   a load P-type field effect transistor (PFET) having a load source, a load drain, and a load gate, the load source and the load drain being coupled between the supply voltage input and the load output;
   a driver circuit including a driver N type field effect transistor (NFET) having a driver drain, a driver source, and a driver gate, the driver drain and the driver source being coupled between the supply voltage input and the ground plane node and the driver source being coupled to the load gate;
   a slew-rate-control circuit including:
      a first capacitor node adapted to be coupled to a first terminal of an external capacitor, the first capacitor node being coupled to the driver gate,
      a power down PFET having a power down source, a power down drain, and a power down gate, the power down source and the power down drain being coupled in series with a first current sink between the supply voltage input and the ground plane node, the power down drain being coupled to the driver gate, the power down gate being adapted to receive a power down bar signal,
      a reset PFET having a reset source, a rest reset drain, and a reset gate, the reset source being coupled to the supply voltage input and the reset gate being adapted to receive an over current protection signal, and
      a feedback NFET having a feedback drain, a feedback source, and a feedback gate, the feedback drain being coupled to the reset drain and the feedback source being coupled to the driver gate, the feedback gate being coupled to the load gate.

6. The load switch circuit of claim 5 including:
   a second current sink coupled between the driver source and the ground plane node; and
   a second power down PFET having a source and a drain coupled between the supply voltage input and the load gate, and having a gate adapted to receive the power down bar signal.

7. The load switch as recited in claim 6 in which a first current passed by the first current sink is less than a second current passed by the second current sink.

8. The load switch as recited in claim 5 including a second capacitor node adapted to be coupled to a second terminal of the external capacitor, the second capacitor node being coupled to the load drain.

9. An integrated circuit comprising:
   a pass transistor coupled between a supply voltage input and a load output, the pass transistor having a control gate;
   a driver circuit having a driver input and having a driver output coupled to the control gate; and
   a slew-rate-control circuit having a power down input, and a slew rate output coupled to the driver input, the slew-rate-control circuit including:
      a first capacitor node adapted to be coupled to a first terminal of an external capacitor, the first capacitor node being coupled to the driver input,
      a slew-rate-control element coupled between the driver input and a first source of voltage; and
      a reset field-effect transistor (FET) coupled between the driver input and a second source of voltage, the reset FET having an over-current-protection input separate from the power down input.

10. The integrated circuit as recited in claim 9 in which the reset FET is a P-type FET (PFET) having a drain coupled to the driver input and a source coupled to the supply voltage input.

11. The integrated circuit as recited in claim 10 in which a second terminal of the external capacitor is coupled to the supply voltage input.

12. The integrated circuit as recited in claim 11 in which the slew-rate-control element includes a current sink coupled between the driver input and a ground plane.

13. The integrated circuit as recited in claim 9 in which the reset FET is an N-type FET (NFET) having a drain coupled to the driver input.

14. The integrated circuit as recited in claim 13 in which the slew-rate-control element includes an element selected from a group consisting of a resistor and a current source, the slew-rate-control element being coupled between a reference voltage and the driver input.

15. The integrated circuit as recited in claim 14 including a feedback circuit that includes a first resistor coupled in series with a second resistor between the load output and a ground plane, a point between the first and second resistors being coupled to provide a second input for the driver circuit.

16. The integrated circuit as recited in claim 13 in which a source of the reset FET is coupled to a ground plane.

17. The integrated circuit as recited in claim 15 in which a source of the reset FET is coupled to the point between the first and second resistors, the slew-rate-control circuit including a reference-current enable PFET coupled in series with a current source between the reference voltage and the driver input and a current sink coupled between the driver input and the ground plane, the reference-current enable PFET having a gate coupled to the over-current-protection input.

18. The integrated circuit as recited in claim 9 in which the circuit is one of a load switch and a low dropout regulator.

* * * * *